(12) United States Patent
Kaatz et al.

(10) Patent No.: US 10,763,798 B2
(45) Date of Patent: *Sep. 1, 2020

(54) VARIABLE IMPEDANCE MATCH AND VARIABLE HARMONIC TERMINATIONS FOR DIFFERENT MODES AND FREQUENCY BANDS

(71) Applicant: pSemi Corporation, San Diego, CA (US)

(72) Inventors: Gary Frederick Kaatz, Barrington, IL (US); Chris Olson, Palatine, IL (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/156,899

(22) Filed: Oct. 10, 2018

(65) Prior Publication Data
US 2019/0115879 A1 Apr. 18, 2019

Related U.S. Application Data

(63) Continuation of application No. 15/422,282, filed on Feb. 1, 2017, now Pat. No. 10,116,272, which is a continuation of application No. 13/797,686, filed on Mar. 12, 2013, now Pat. No. 9,602,083.

(51) Int. Cl.
| H03F 1/56 | (2006.01) |
| H03F 1/32 | (2006.01) |
| H03F 3/193 | (2006.01) |
| H03F 3/217 | (2006.01) |
| H03H 7/40 | (2006.01) |
| H03F 3/60 | (2006.01) |
| H03H 7/01 | (2006.01) |

(52) U.S. Cl.
CPC .......... *H03F 1/565* (2013.01); *H03F 1/3205* (2013.01); *H03F 3/193* (2013.01); *H03F 3/217* (2013.01); *H03F 3/607* (2013.01); *H03H 7/40* (2013.01); *H03H 7/0123* (2013.01)

(58) Field of Classification Search
CPC ........ H03F 1/565; H03F 1/3205; H03F 3/193; H03F 3/217; H03F 3/607; H03H 7/40
See application file for complete search history.

(56) References Cited

U.S. PATENT DOCUMENTS

| 9,602,063 | B2 * | 3/2017 | Kaatz | H03F 1/565 |
| 10,116,272 | B2 * | 10/2018 | Kaatz | H03F 1/565 |
| 10,333,471 | B2 | 6/2019 | Nobbe et al. | |
| 2007/0018758 | A1 * | 1/2007 | Fukuda | H01P 5/02 333/263 |

(Continued)

OTHER PUBLICATIONS

Nguyen, Hieu P., Notice of Allowance received from the USPTO dated Feb. 5, 2018 for U.S. Appl. No. 15/827,984, 9 pgs.

(Continued)

*Primary Examiner* — Samuel S Outten
(74) *Attorney, Agent, or Firm* — Jaquez Land Greenhaus LLP; Alessandro Steinfl, Esq.

(57) ABSTRACT

An amplifier with switchable and tunable harmonic terminations and a variable impedance matching network is presented. The amplifier can adapt to different modes and different frequency bands of operation by appropriate switching and/or tuning of the harmonic terminations and/or the variable impedance matching network.

14 Claims, 10 Drawing Sheets

(56) References Cited

U.S. PATENT DOCUMENTS

| | | |
|---|---|---|
| 2011/0260780 A1* | 10/2011 | Granger-Jones ..... H03K 17/102 327/537 |
| 2012/0154054 A1* | 6/2012 | Kaczman ................ H03F 1/083 330/295 |
| 2017/0149391 A1 | 5/2017 | Kaatz et al. |
| 2019/0267954 A1 | 8/2019 | Nobbe et al. |
| 2020/0111756 A1 | 4/2020 | Smith et al. |

OTHER PUBLICATIONS

Outten, Samuel S., Office Action received from the USPTO dated Sep. 26, 2017 for U.S. Appl. No. 15/422,282, 34 pgs.
Outten, Samuel S., Final Office Action received from the USPTO dated Mar. 9, 2018 for U.S. Appl. No. 15/422,282, 30 pgs.
Outten, Samuel S., Notice of Allowance received from the USPTO dated Jul. 16, 2018 for U.S. Appl. No. 15/422,282, 9 pgs.
Kaatz, et al., Response filed in the USPTO on Nov. 24, 2017 for U.S. Appl. No. 15/422,282, 10 pgs.
Kaatz, et al., Response filed in the USPTO on May 3, 2018 for U.S. Appl. No. 15/422,282, 11 pgs.
Nguyen, Hieu P., Office Action received from the USPTO dated Sep. 25, 2018 for U.S. Appl. No. 15/827,984, 14 pgs.
Nguyen, Hieu P., Office Action received from the USPTO dated Nov. 6, 2019 for U.S. Appl. No. 16/408,001, 26 pgs.
Nguyen, Hieu P., Notice of Allowance received from the USPTO dated Apr. 22, 2020 for U.S. Appl. No. 16/408,001, 11 pgs.

\* cited by examiner

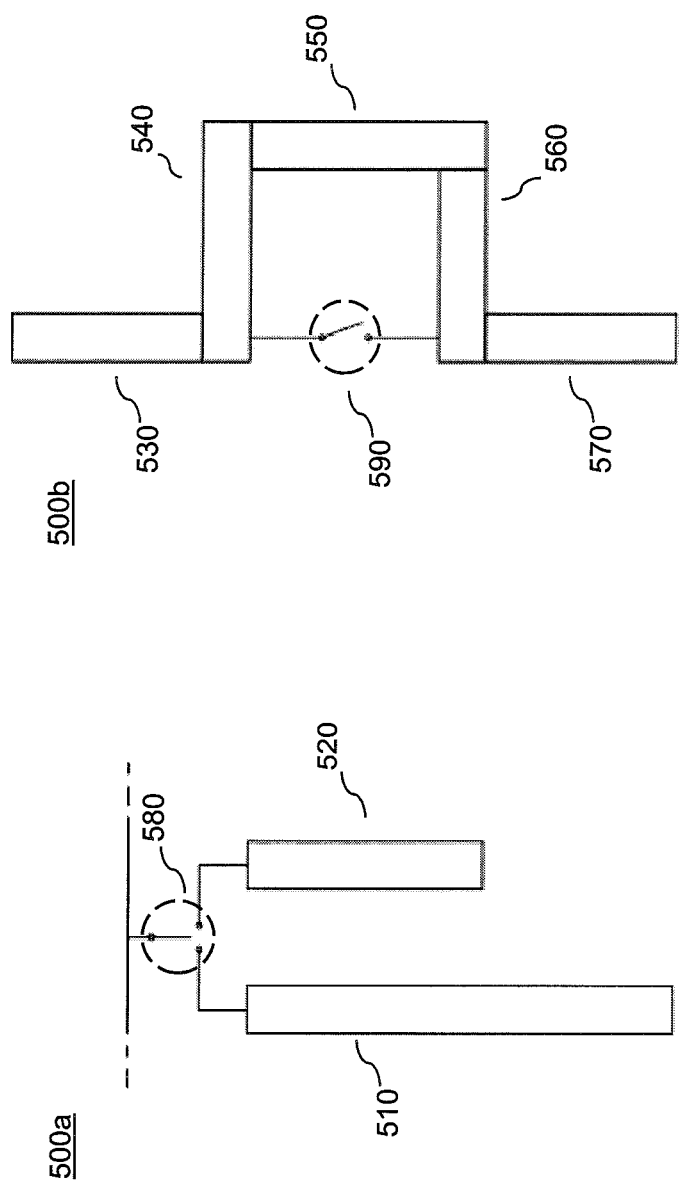

VARIABLE IMPEDANCE MATCH AND VARIABLE HARMONIC TERMINATIONS FOR DIFFERENT MODES AND FREQUENCY BANDS

CROSS REFERENCE TO RELATED APPLICATIONS—CLAIM OF PRIORITY

This application is a continuation application of co-pending U.S. application Ser. No. 15/422,282, "Variable Impedance Match and Variable Harmonic Terminations for Different Modes and Frequency Bands", filed Feb. 1, 2017, which is incorporated herein by reference in its entirety. Application Ser. No. 15/422,282 is a continuation application of U.S. application Ser. No. 13/797,686, "Variable Impedance Match and Variable Harmonic Terminations for Different Modes and Frequency Bands", filed Mar. 12, 2013, now U.S. Pat. No. 9,602,063 issued Mar. 21, 2017, which is incorporated herein by reference in its entirety. The present application may be related to U.S. patent application Ser. No. 13/797,779 filed on Mar. 12, 2013, now U.S. Pat. No. 9,294,056 issued on Mar. 22, 2016, entitled "Scalable Periphery Tunable Matching Power Amplifier", which is incorporated herein by reference in its entirety.

BACKGROUND

1. Field

The present teachings relate to amplifiers. More particularly, the present teachings relate to a variable impedance match and variable harmonic terminations for different modes and frequency bands.

2. Description of Related Art

A transistor, such as a field effect transistor (FET), that is configured to operate as a small signal amplifier and, for example, accepts a pure sine wave (e.g. no high order harmonic components) at an input (e.g. gate) terminal and produces a nearly pure sine wave at an output (e.g. drain) terminal of the transistor and will produce minimal harmonic components at the output terminal of the transistor. However, a transistor that is configured to operate as a switching power amplifier that produces a non-sinusoidal waveform at an output terminal of the transistor will produce harmonic components at the output terminal. Non-sinusoidal waveforms include such waveforms as a clipped sine wave, a square wave or near square wave, among other possibilities. As is known by a person skilled in the art, certain harmonic components can degrade linearity and efficiency characteristics of the transistor that is configured to operate as an amplifier.

As used in the present disclosure, the term "couple" can refer to a degree by which various electronic components affect each other, without being necessarily physically connected. For example, a capacitor connected in series with a resistor at the output (terminal) of an amplifier, the resistor being connected to the amplifier and the capacitor being connected to ground, the capacitor will affect an output signal generated by the amplifier. This capacitor is coupled to the output of the amplifier. In some cases, coupling can be used within the context of an entire circuital arrangement, for example an amplifier fitted with an output filter containing various components. If all the components of the filter provide a contribution to the filter response, thus affect the output signal of the amplifier to provide a modified signal at the output of the arrangement, then as used in the present disclosure, all the filter components are coupled to the amplifier output.

As used in the present disclosure, the term "decouple" can refer to a lack of any affect or influence between various electronic components, even if some of these components are physically connected. For example, a capacitor connected to an output (terminal) of an amplifier, with one side directly connected to the amplifier output and the other side connected to ground, is coupled to the amplifier and will affect an output signal generated by the amplifier. Removing the ground connection of the capacitor will remove the electrical influence of the capacitor over the output signal as the latter will become completely independent of the capacitor, although still physically connected to it. In this case, the capacitor is decoupled from the amplifier (output). Using the example above of the circuital arrangement, a filter component that does not affect the response of the filter, and thus does not affect the output signal of the amplifier, as used in the present disclosure is said to be decoupled from the amplifier output.

The output terminal of an amplifier device can be coupled to one or more waveform shaping elements (e.g. filters) that for example attenuate the even harmonics and enhance the odd harmonics, for improved linearity and efficiency. Throughout the present disclosure such waveform shaping elements will be referred to as harmonic terminations, or harmonic impedance terminations, interchangeably. Harmonic shorts and harmonic opens are examples of harmonic termination. An even harmonic short at the drain output terminal can shunt an even harmonic component of an input signal present at the drain output terminal to ground, effectively removing or attenuating the even harmonic component from the input signal. An odd harmonic open at the drain output terminal can prevent the amplifier from seeing any load other than the output impedance of the amplifier itself at the corresponding odd harmonic frequency. For discussion purposes, a waveform of the voltage signal at the drain output terminal may be referred to as a drain voltage waveform whereas a waveform of the current signal at the drain output terminal may be referred to as a drain current waveform. Either waveform may be subject to waveform shaping.

Odd order intermodulation can impact the linearity characteristics of a system. Attenuation of the second harmonic (the first even harmonic waveform shaping element), via for example a second harmonic short, can improve linearity since the second harmonic can mix with the fundamental to generate third-order intermodulation products close to the operating frequency of the amplifier and thus affect linearity. A fourth harmonic short can improve linearity by attenuating the fourth harmonic, which can generate fifth-order intermodulation products and thus affect linearity. Similarly, an $n^{th}$ harmonic short, where n is an even integer, can improve linearity by attenuating the $n^{th}$ harmonic, which can generate $(n+1)^{th}$-order intermodulation products and thus affect linearity.

Generally, the fifth-order intermodulation products are considerably smaller in magnitude than the third-order intermodulation products and similarly, the seventh-order intermodulation products are considerably smaller in magnitude than the fifth-order intermodulation products. Therefore, eliminating third-order intermodulation is generally more effective, and in many cases sufficient, to maintain linearity.

Second-order intermodulation products generally are outside a passband of the amplifier and therefore can generally be ignored. Fourth-order and higher even order intermodulation products are generally small in magnitude and outside a passband of the amplifier and therefore can generally be ignored.

The combination of even harmonic shorts and odd harmonic opens can shape the drain voltage waveform and the drain current waveform to provide higher efficiency by reducing overlap of drain voltage and drain current waveforms. A square wave with 50% duty cycle has no even harmonic components, and thus a combination of second and fourth harmonic shorts together with third and fifth harmonic opens provides a near square wave drain voltage waveform.

Generally, an amplifier output match can be connected between an output terminal of the amplifier and a load in order to provide impedance matching between the output terminal of the amplifier and the load. The amplifier output match can be different for different modulation and coding schemes (e.g. GMSK (Gaussian minimum shift keying), 8PSK (eight-phase shift keying), H-PSK (hybrid phase shift keying), orthogonal frequency multiplexing and DFT-spread orthogonal frequency multiplexing), such as are utilized in cellular access standards (e.g. GSM, EDGE, WCDMA, LTE, and so forth) because power level and linearity requirements are different for each modulation and coding scheme.

Many amplifiers, such as power amplifiers, employed in today's cellular phones have a fixed-tuned output match (e.g. constructed using components of fixed values), which restricts operation to a single frequency band and a single modulation and coding scheme. As known by one skilled in the art, the term "frequency band" may refer to a range of frequencies that is around the operating frequency and that extends above and below the operating frequency by certain deviation(s) and the term "modulation and coding scheme" may refer to a particular method of modulating a signal to encode information. In many applications, it may be desirable to have amplifiers capable of operating on more than one frequency band and/or modulation and coding scheme. Switching and/or tuning the harmonic terminations (e.g. harmonic opens and harmonic shorts) and/or the amplifier output match based on frequency band and/or modulation and coding scheme can provide optimum results for a given frequency band and/or modulation and coding scheme.

SUMMARY

According to a first aspect of the present disclosure, an arrangement configured to receive and amplify a first signal is presented, the arrangement comprising: an amplifier having an amplifier output terminal, wherein, during operation of the arrangement, the amplifier generates a second signal by amplifying the first signal; one or more harmonic impedance terminations operatively coupled to the amplifier output terminal, and one or more switches operatively connected to the one or more harmonic impedance terminations, wherein the one or more switches are configured to affect an impedance realized by the one or more harmonic impedance terminations.

According to a second aspect of the present disclosure, an arrangement configured to receive and amplify a first signal is presented, the arrangement comprising: an amplifier having an amplifier output terminal, wherein, during operation of the arrangement, the amplifier generates a second signal by amplifying the first signal; one or more harmonic shorts operatively connected between the amplifier output terminal and a reference voltage, and one or more switches operatively connected to one or more harmonic shorts of the one or more harmonic shorts, wherein the one or more switches are configured to operatively decouple the amplifier output terminal from the one or more harmonic shorts.

According to a third aspect of the present disclosure, an arrangement configured to receive and amplify a first signal is presented, the arrangement comprising: an amplifier having an amplifier output terminal, wherein, during operation of the arrangement, the amplifier generates a second signal by amplifying the first signal, and a harmonic open arrangement operatively connected in series to the amplifier output terminal, wherein the harmonic open arrangement comprises one or more harmonic opens operatively connected in series, and one or more switches operatively coupled to at least one of the one or more harmonic opens, the one or more switches being configured to provide a bypass path for the second signal, the bypass path bypassing at least one of the one or more harmonic opens.

According to a fourth aspect of the present disclosure, an arrangement configured to receive and amplify a first signal is presented, the arrangement comprising: an amplifier having an amplifier output terminal, wherein, during operation of the arrangement, the amplifier generates a second signal by amplifying the first signal; one or more harmonic shorts operatively connected between the amplifier output terminal and a reference voltage; one or more switches operatively connected to at least one of the one or more harmonic shorts, the one or more switches being configured to operatively decouple the amplifier output terminal from the one or more harmonic shorts, and a harmonic open arrangement operatively connected in series to the amplifier output terminal, wherein the harmonic open arrangement comprises one or more harmonic opens operatively connected in series, and one or more switches operatively coupled to at least one of the one or more harmonic opens, the one or more switches being configured to provide a bypass path for the second signal, the bypass path bypassing at least one of the one or more harmonic opens.

According to a fifth aspect of the present disclosure, a signal-shaping method is presented, the method comprising: providing an amplifier configured to amplify an input signal at an input terminal of the amplifier and output a corresponding amplified signal at an output terminal of the amplifier, the amplifier having an operating parameter; operatively coupling one or more harmonic shorts in parallel to the output terminal of the amplifier; operatively coupling in series one or more harmonic opens to the output terminal of the amplifier; operatively coupling one or more switches to the one or more harmonic shorts and to the one or more harmonic opens; activating and/or deactivating the one or more switches as a function of the operating parameter; coupling and/or decoupling the one or more harmonic shorts and harmonic opens to and from the output terminal as a function of the activating and/or deactivating; configuring the one or more harmonic shorts and/or the one or more harmonic opens as a function of the activating and/or deactivating; adjusting one or more harmonics of the output signal as a function of said coupling and/or decoupling and configuring; and shaping the output signal as a function of the adjusting.

BRIEF DESCRIPTION OF THE DRAWINGS

FIGS. 5A and 5B shows an example implementation of switchable harmonic terminations using transmission lines.

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

In many applications, it may be desirable to have amplifiers capable of operating on more than one frequency band and/or modulation and coding scheme. Switching and/or tuning the harmonic terminations (e.g. harmonic opens and harmonic shorts) and/or the amplifier output match based on frequency band and/or modulation and coding scheme can provide optimum results for the given frequency band and/or modulation and coding scheme. According to an embodiment of the present disclosure, an amplifier with switchable harmonic terminations and a switchable and/or tunable output impedance match can be provided. The amplifier can operate on multiple bands and/or modulation and coding schemes by appropriate switching and/or tuning. This will be explained in more detail below.

As used herein, the term "switching" may refer to changing configuration of a switch to connect or disconnect certain components. As used herein, the term "tuning" may refer to dynamically adjusting values of individual components as a function of changing conditions in order to achieve certain characteristics of an apparatus comprising the individual components. As used herein, the term "variable" can refer to both "switching" and "tuning".

As used herein, the term "operating frequency" can refer to frequency of a signal being input to a device (such as an amplifier). As used herein, the term "fundamental" can refer to a primary signal component at the operating frequency of the device. As used herein, the term "harmonic" can refer to a signal component at a frequency equal to n times the operating frequency, where n can be any integer greater than or equal to 2.

Figure 1A:
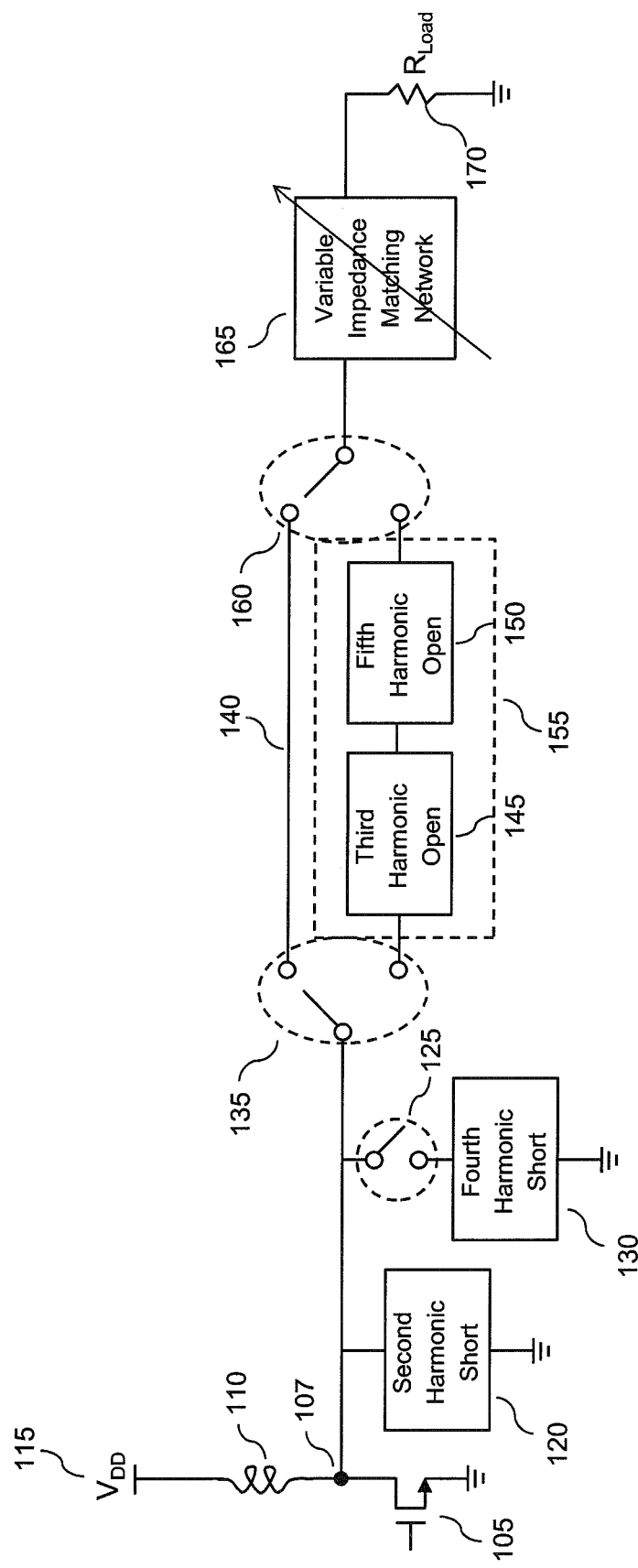
FIG. 1A shows an arrangement according to an embodiment of the present disclosure of an amplifier with switchable harmonic terminations and a variable impedance matching network at an output of the amplifier.

FIG. 1A shows an arrangement according to an embodiment of the present disclosure comprising an amplifier (105) with switchable harmonic terminations (130, 145, 150) at an output terminal (107) of the amplifier (105). According to this embodiment, the arrangement further comprises a variable impedance matching network (165) that may be coupled to the amplifier (105) and one or more of the switchable harmonic terminations (130, 145, 150). Although the amplifier (105) is depicted as a single NMOS transistor (105), a person skilled in the art will realize that the transistor (105) can also represent an output transistor from among a plurality of transistors (e.g. cascade, cascode, stacked, and so on) that construct an amplifier. Furthermore, a person skilled in the art will realize other types of active semiconductor devices (e.g. silicon PMOS FET, NMOS FET, BJT, GaAs FET, HEMT, HBT, GaN FET, and so on) can also be used in designing and constructing the amplifier (105). In some embodiments the amplifier can be a scalable periphery amplifier, composed of stacked unit cells in a parallel configuration, each unit cell being an amplifier, and switches configured to activate/deactivate the unit cells according to some desired mode of operation.

In the embodiment shown in FIG. 1A, a drain terminal (107) of the amplifier (105) is connected to a supply voltage $V_{DD}$ (115) through an inductor (110). The drain terminal (107) of the amplifier (105) is further connected to a second harmonic short (120). The drain terminal (107) can also be connected to a first terminal of a switch (125), where a second terminal of the switch (125) further connects to a fourth harmonic short (130). Both harmonic shorts (120, 130) are shunt connected to ground (or a reference voltage). The drain terminal (107) is further connected to a switch (135). The skilled person will know that an equivalent configuration to selectively shunting the fourth harmonic short (130) at the output terminal (107) of the amplifier (105), is to connect the fourth harmonic short (130) to the terminal (107) and the switch (125) to ground and the fourth harmonic short (130).

The switch (135) can be operated to connect to either a through circuit (140) or a harmonic open circuit (155). Terminals of the through circuit (140) and the harmonic open circuit (155) that are distal from the switch (135) can connect to a switch (160). The switches (135) and (160) can be operated in tandem to select either the through circuit (140) or the harmonic open circuit (155). The harmonic open circuit (155) can comprise a third harmonic open (145) and a fifth harmonic open (150) connected in series. A person skilled in the art will realize that higher order harmonic opens and/or higher order harmonic shorts can also be added to the arrangement shown in FIG. 1A in a manner similar to what is shown in FIG. 1A. According to one embodiment, the through circuit (140) is configured to pass a signal from the drain terminal (107) to the variable impedance match network (165) without altering magnitude and phase of the signal.

An outbound terminal of the switch (160) can be connected to a first port of the variable impedance matching network (165). A second port of the variable impedance matching network (165) can be connected to a load (170). The variable impedance matching network (165) performs impedance matching between the drain terminal (107) and the load (170). The load (170) can comprise, for example, an antenna or circuitry associated with an antenna. As known by the skilled person, such circuitry may be a low pass filter followed by an antenna switch, or a duplexer followed by an antenna switch. By way of further example, the load (170) can present a 50Ω impedance, which is a common standard in RF circuit design. Any switches or switching circuitry of the present disclosure, such as switches (125, 135, 160)

shown in FIG. 1A, can be implemented using transistors, stacked transistors (FETs), diodes, or any other devices or techniques known to or which can be envisioned by a person skilled in the art. In particular, such switching circuitry can be constructed using CMOS technology and various architectures known to the skilled person, such as, for example, architecture presented in U.S. Pat. No. 7,910,993, issued on Mar. 22, 2011 and entitled "Method and Apparatus for use in Improving Linearity of MOSFET's using an Accumulated Charge Sink", and in U.S. Pat. No. 6,804,502, issued on Oct. 12, 2004 and entitled "Switch Circuit and Method of Switching Radio Frequency Signals", both incorporated herein by reference in their entirety.

The variable impedance matching network (165) can comprise a tunable impedance matching network with one or more inductors and/or one or more capacitors, where one or more of these inductors and/or capacitors can be tunable elements, connected in an arrangement such that tuning can be accomplished by adjusting values of the tunable elements. In some embodiments, transmission lines of determined length with respect to the wavelength corresponding to the operating frequency of the transmitted signal may be used in addition to or instead of an inductor within the variable impedance matching network. FIGS. 5A and 5B which are later described depict such tunable impedances using transmission lines of various lengths.

By way of example, and not of limitation, tunable elements include digitally tunable capacitors and digitally tunable inductors. Digitally tunable capacitors (DTCs) are described, for example, in International Application No. PCT/US2009/001358, entitled "Method and Apparatus For Use In Digitally Tuning a Capacitor In an Integrated Circuit Device", filed on Mar. 2, 2009, incorporated by reference herein in its entirety. Digitally tunable inductors (DTLs) are described, for example, in U.S. patent application Ser. No. 13/595,893, "Method and Apparatus for Use in Tuning Reactance in a Circuit Device", filed on Aug. 27, 2012, incorporated by reference herein in its entirety.

Figure 1B:
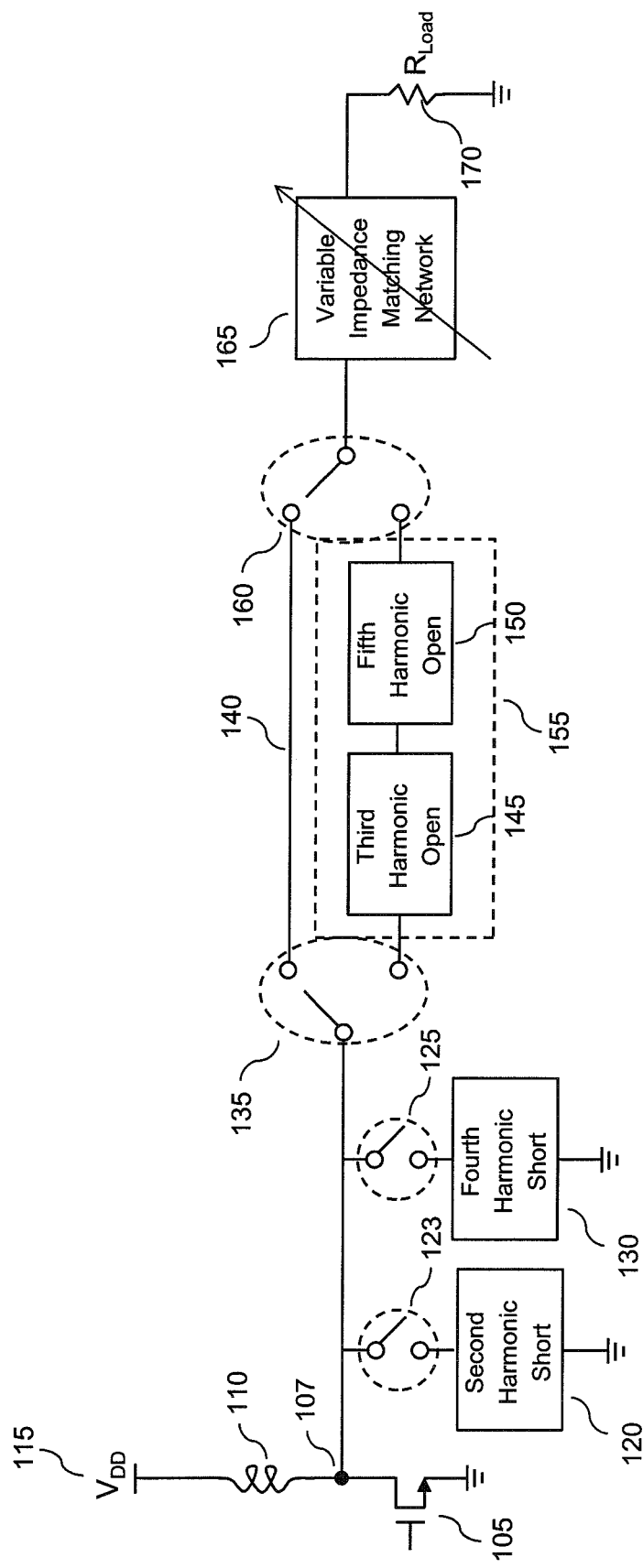
FIG. 1B shows an arrangement similar to the arrangement shown in FIG. 1A with an additional switch between the output of the amplifier and a second harmonic short.

FIG. 1B shows another arrangement according to an embodiment of the present disclosure that is similar to the arrangement shown in FIG. 1A except for the addition of a switch (123) that is placed between the drain terminal (107) and the second harmonic short (120). Although a single second harmonic short is shown in FIG. 1B, it should be noted that additional band-specific second harmonic shorts may be employed, each selected for example, via a dedicated switch as depicted by the combination (120, 123) of FIG. 1B. It is noted that higher order harmonic opens and/or higher order harmonic shorts can also be added to the arrangement shown in FIG. 1B in a manner similar to what is shown in FIG. 1B. Because all harmonic terminations in the embodiment shown in FIG. 1B are connected to switches, more versatility in selecting certain harmonic terminations to be included or excluded from circuit operation is possible.

In general, appropriate operation of switches, such as switches (123, 125, 135, 160) shown in FIG. 1B, can adapt embodiments of the present disclosure for operation with different modulation and coding schemes by virtue of selecting harmonic terminations to be included or excluded from circuit operation. Appropriate tuning of tunable elements that construct harmonic terminations, as well as tunable elements that construct the tunable impedance matching network (an embodiment of the variable impedance matching network (165)) can adapt embodiments of the present disclosure for operation on different frequency bands by virtue of modifying resonant frequencies of harmonics terminations and adjusting the tunable impedance matching network for different frequencies as needed.

Figure 1C:
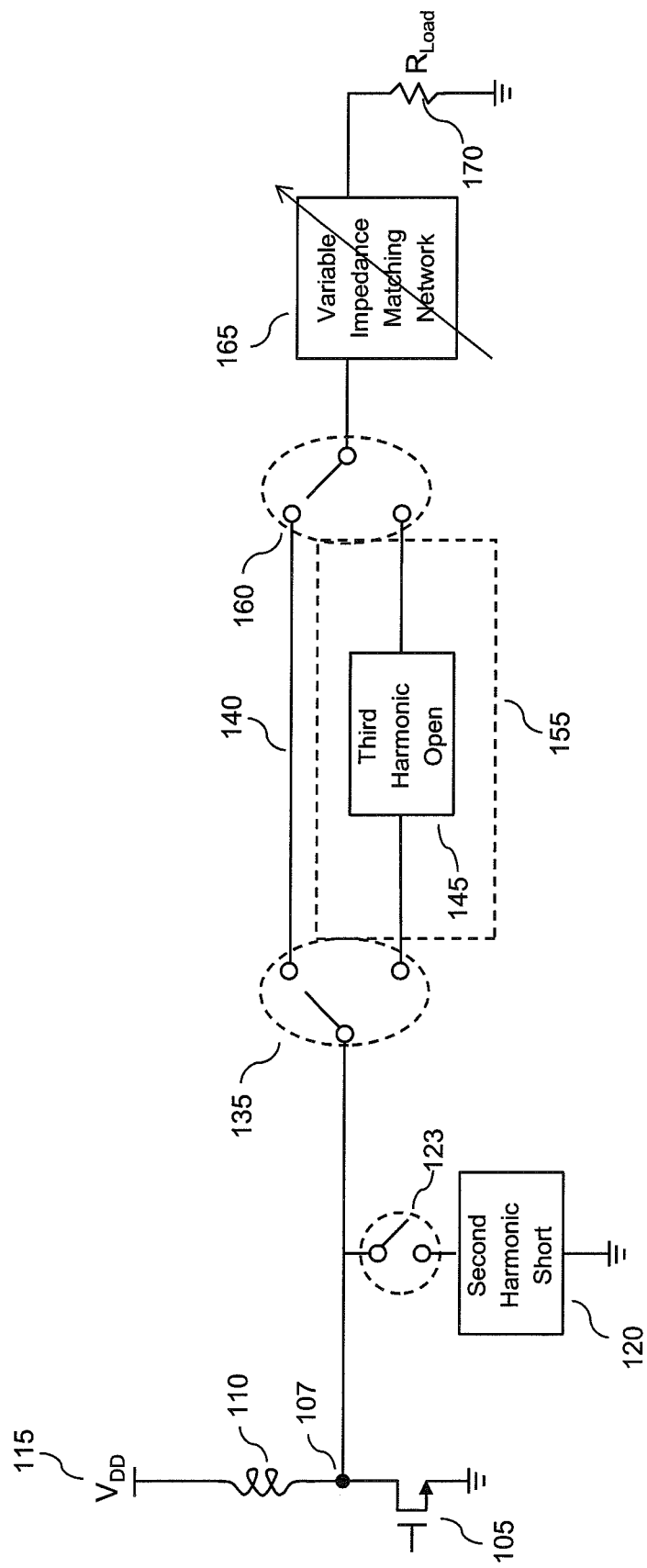
FIG. 1C shows an arrangement similar to the arrangement shown in FIG. 1B with a single even harmonic short and a single odd harmonic open.

Another embodiment according to the present disclosure comprises one even harmonic short and one odd harmonic open as shown in FIG. 1C.

Figure 1D:
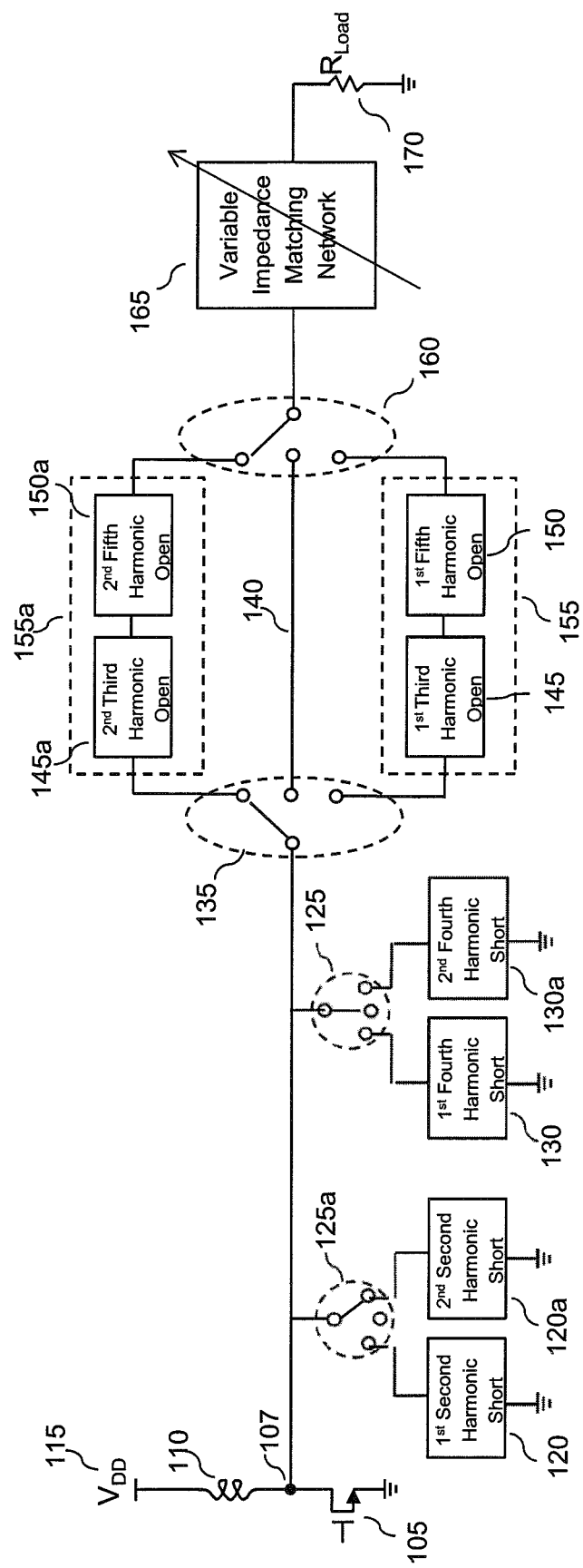
FIG. 1D shows an arrangement according to an embodiment of the present disclosure with a plurality of parallel arrangements, each arrangement comprising harmonic shorts, harmonic opens and a variable/tunable impedance matching network connected at the drain terminal of the amplifier.

A further embodiment according to the present disclosure comprises an arrangement comprising a plurality of parallel harmonic shorts and harmonic opens configured for different fundamental frequencies, and selectable via a plurality of switches operating in unison to select a configuration for a desired frequency of operation of the arrangement, as depicted by FIG. 1D. By way of example, and not of limitation, the embodiment of FIG. 1D can comprise two sets of parallel harmonic impedances: a first set (120, 130, 155) and a second set (120a, 130a, 155a), each set selectable via switches (125, 125a, 135, 160). The first set of harmonic impedances and the second set of harmonic impedances can be configured to operate at different fundamental frequencies from each other, which can correspond to the desired operating frequency of the arrangement.

Switches (125, 125a, 135, 160) allow configuring the arrangement of FIG. 1D to two equivalent configurations to FIG. 1A, each operating at different fundamental frequencies. By selecting a $1^{st}$ set, the arrangement of FIG. 1D is identical in operation to the arrangement of FIG. 1A where the drain terminal (107) can be directly coupled to a $1^{st}$ second harmonic short (120). The drain terminal (107) can further be connected to a $1^{st}$ fourth harmonic short (130) via switch (125), the harmonic open circuit (155) or the through circuit (140) via switch (135) and a variable impedance matching network (165) and load (170) via switch (160).

By selecting a $2^{nd}$ set, the arrangement of FIG. 1D is identical in operation to the arrangement of FIG. 1A, where the drain terminal of the amplifier (105) is further connected to the harmonic impedances of the second set of the arrangement, which comprises a $2^{nd}$ second harmonic short (120a), a $2^{nd}$ fourth harmonic short (130a), the harmonic open circuit (155a) or the through circuit (140) via switch (135), and the variable impedance matching network (165) and load (170) via switch (160). In the embodiments of FIGS. 1A-1D, the switches in between the drain terminal (107) and the harmonic shorts, harmonic opens, and variable impedance matching network enable these circuits to switch between different modes and different bands of operations, thus providing configurability of the circuits dependent on application.

The variable impedance matching network (165) can also comprise plurality of shunt connected fixed reactances and/or plurality of series connected fixed reactances to provide better flexibility in switching and also for example, to enable the embodiments of FIGS. 1A-1D to switch between multiple frequency bands of operation as well as multiple modes of operation (for example: GSM, EDGE, WCDMA, LTE, etc.).

Different operating frequency bands and/or modulation and coding schemes can be optimized by presenting differing impedances to the drain terminal (107) of the amplifier (105) (of FIGS. 1A to 1C). This will be explained in more detail below. Two examples (GSM and WCDMA) will be discussed. The following discussion of these two examples will enable a person skilled in the art to extend the teachings of the present disclosure to other modulation and coding schemes. The following discussion will describe how the circuit shown in FIG. 1A can be optimized for either GSM or WCDMA.

GSM (global system for mobile communication) has higher power output, higher efficiency, and lower linearity requirements than WCDMA (wideband code division multiple access). Additionally, the GMSK modulation and coding as employed in GSM is generally associated with a constant envelope, in contrast to the H-PSK modulation used for WCDMA, which has a non-constant envelope modulation. The odd harmonic opens, specially the third harmonic open in GMSK mode are present to shape the output waveform. For any modulation and coding scheme, an optimal load resistance (e.g. a design impedance) can be approximately equal to the square of a supply voltage less a saturation voltage divided by twice an intended power output to be delivered to the load, as given by the equation: $R_L \approx (V_{DD} - V_{SAT})^2 / (2 \times P_o)$. In general, as long as the supply voltage $V_{DD}$ (115) is fixed, the load impedance required for high power GMSK is less than that required for WCDMA. Supply voltage in cellular handsets is typically 3.5 V.

As an example, for GMSK at 34.5 dBm (2.8 W), an optimum configuration should provide a load resistance of about 2Ω, second and fourth harmonic shorts, and third and fifth harmonic opens, where a presence of the harmonic shorts and opens can result in appropriate phase and amplitude of these harmonics that will produce a near square wave drain voltage waveform. As used herein, the term "configuration" may refer to a particular arrangement of harmonic terminations connected to the drain output terminal (107) and load resistance present at an output of an arrangement comprising the transistor (105) and harmonic terminations connected to the drain output terminal (107). As discussed previously, the near square wave drain voltage waveform reduces overlap of drain voltage and drain current, thereby increasing efficiency. Furthermore it should be noted that due to the nature of the GMSK modulation scheme, which has a constant modulation envelope, usage of the more efficient non-linear amplifier is desirable. Saturated class C amplifiers and switching class D, E or F amplifiers, are examples of such non-linear amplifiers.

WCDMA (Wideband Code Division Multiple Access) generally has a lower peak power output but higher linearity requirements than GSM. The even harmonic shorts, specially the second harmonic short in WCDMA mode are present to improve linearity. However, efficiency of WCDMA is possibly lower than GMSK because the average power of WCDMA is 3 or more dB below the peak power of WCDMA, while the average power of GMSK is the same as the peak power of GMSK. For better linearity (e.g. generally an important consideration for WCDMA) at least a second harmonic short is required, which as discussed earlier reduces the third-order intermodulation products. As an example, for WCDMA at 28 dBm (0.63 W), a load resistance of about 5Ω and a second harmonic short should minimally be provided. Furthermore it should be noted that due to the nature of the H-PSK modulation scheme used for WCDMA, which has a non-constant modulation envelope, usage of a linear amplifier, such as a class AB amplifier, is desired.

During a first mode of operation, assuming that the transistor (105) is driven at sufficiently high amplitude to operate nearly as a switch, the arrangement shown in FIG. 1A can be adapted for higher efficiency (e.g. for GMSK) by shorting even harmonics (e.g. by closing switch (125)) and emphasizing odd harmonics of the fundamental (e.g. by operating the switches (135, 160) in a manner such as to select the harmonic open circuit (155)) at the drain terminal (107), thus producing a near square wave drain terminal (107) voltage waveform. This results in a class F amplifier. A class F amplifier typically has high efficiency because the drain current waveform and drain voltage waveform have little overlap. Class F amplifier optimally sets the amplitude of the third harmonic to get a better shaped square wave. It should be noted that in some cases it is possible that the amplifier device does not generate a high enough level of odd harmonics to fully optimize the waveform shaping or generates too much so that the harmonic opens really need to be not fully "open" but present some load so as to reduce the odd harmonic amplitudes to suitable levels. This may also be achieved by odd harmonic "near" shorts that attenuate preferably at the same location as the even harmonic shorts.

During the first mode of operation, switch (125) can be closed in order to provide both second and fourth harmonic shorts at drain terminal (107) via second harmonic short (120) and fourth harmonic short (130). Also, during the first mode of operation, switches (135, 160) can be set to connect the harmonic open circuit (155) between the drain terminal (107) and an input of the variable impedance matching network (165) in order to emphasize odd harmonics of the fundamental at the drain terminal (107). The variable impedance matching network (165) can be adjusted to transform the impedance of the load (170) to 2Ω, in accordance with the previously described example of GMSK at 34.5 dBm (2.8 W).

During a second mode of operation, the arrangement shown in FIG. 1A can be adapted for best linearity (e.g. generally an important consideration for WCDMA) by shorting only the second harmonic. This can be accomplished by opening switch (125) and setting switches (135, 160) to connect the through circuit (140) between the drain terminal (107) and the input of the variable impedance matching network (165). Such a switch operation effectively removes the fourth harmonic short (130), the third harmonic open (145), and the fifth harmonic open (150) from the circuit. The variable impedance matching network (165) can be adjusted to transform the impedance of the load (170) to 5Ω, in accordance with the previously described example of WCDMA at 28 dBm (0.63 W). It should be further noted that in either first or second mode of operation, the shorts and opens are tuned for a desired frequency band of operation.

As seen in the previous paragraphs, amplification of a constant envelope modulation versus a non-constant envelope modulation signal imposes different requirements on the amplification characteristics, where linearity is of prime importance in the non-constant envelope case and efficiency in the constant envelope case. To this end, in some embodiments it is desirable to control the class of operation of the amplifier.

An amplifier's class of operation and output power is determined by the bias point, the input drive level and the load network. A transconductance amplifier, such as one used in RF signal amplification, behaves like a controlled current source when conducting and an open circuit when not conducting. In classical transconductance amplifiers, the class of operation is defined by the conduction angle of the active device. Class-A amplifiers have 360 degrees of conduction, class-B have 180 degrees of conduction and class C have less than 180 degrees of conduction. Class-AB has a conduction angle between that of class-A and B. When the conduction angle is less than 180 degrees, the amplifier is non-linear. Typically, the bias point decreases and the amplitude of the drive voltage at the amplifier input increases from class-A to class-C. Limited waveform shaping of the drain voltage or current by employing harmonic shorts and opens can be applied to improve efficiency. A class-F amplifier results from applying this type of waveform shaping to a class-AB amplifier.

Switch-mode amplifiers are usually not biased and are always overdriven, typically with square waves, so that they act like a low impedance when on and an open circuit when off. Pulse-width modulation of the drive may also be employed to vary the amplitude of the amplifier output. Otherwise, the class of operation is entirely determined by the load network. The load network is a multi-harmonic design, providing specific impedances to each significant harmonic with the intent to prevent overlap of drain current and voltage. Switch-mode amplifiers are always non-linear. The primary switch-mode amplifier classes are D and E and the overdriven class-F.

Therefore, one can control the class of amplification, linear or non-linear operation, power output and the efficiency of an amplifier by adjusting the bias point, drive level and the load network. This is typically done when switching between constant-envelope and non-constant envelope modulation where linearity is of prime concern for the latter and efficiency is of prime concern for the former.

Figure 2:
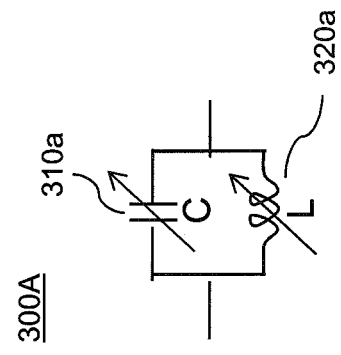
FIG. 2 shows an example implementation of a harmonic short.

FIG. 2 shows an example implementation of a harmonic short. Such a circuit can be used to construct both the second harmonic short (120) and the fourth harmonic short (130) shown in FIG. 1A with appropriate modifications in component values. Resonant frequency of the harmonic short shown in FIG. 2 can be determined according to the formula $f_r=1/(2\pi\sqrt{LC})$, where $f_r$ represents the resonant frequency, L represents inductance of inductor (220) in henries, and C represents capacitance of capacitor (210) in farads. At the resonant frequency, which is an even harmonic of the operating frequency, the circuit shown in FIG. 2 can present an extremely low impedance, equivalent to a short circuit. Generally, the circuit is designed in such a way that, at the resonant frequency, impedance of the circuit is close to one tenth of the design impedance (e.g. $R_L \approx (V_{DD}-V_{SAT})^2/(2\times P_o)$), thus acting like a short circuit. The skilled person would know that a shorted quarter wave transmission line at the operating frequency can also be used as a harmonic short, as it will provide a short at all even harmonics.

Figure 2A:
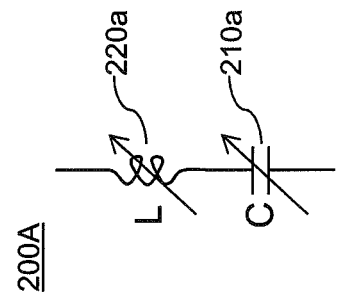
FIG. 2A shows an example implementation of a variable harmonic short.

Component values can be selected such that the circuit shown in FIG. 2 presents a short at a given frequency of interest (e.g. the second harmonic or the fourth harmonic of the fundamental). If the circuit shown in FIG. 2 is constructed using a DTC and/or a DTL, a change in the operating frequency can be compensated for by a change in capacitance and/or inductance value of the DTC and/or a DTL such that the circuit continues to present a short at either the second or the fourth harmonic as needed. By making the capacitor (210) and/or the inductor (220) tunable or using a DTC and/or a DTL in the circuit of FIG. 2, band-specific different second harmonic shorts can also be achieved as well. The DTC and/or a DTL can be tuned/adjusted for different harmonics and resonant frequencies and thus making the second harmonic short of FIG. 2 compatible for multi-band and multi-mode. Such a configuration is presented in FIG. 2A, where the capacitor (210a) and the inductor (220a) are variable (e.g. DTC, DTL). In another embodiment, two or more switchable capacitors or inductors can be added to achieve multi band operation. By making either the inductor (220) and/or the capacitor (210) variable, such as in the case of (220a) and (210a) of FIG. 2A, the resonant frequency can be varied. By way of example and not of limitation, if the operating frequency is 1.880 GHz, the second harmonic short (120) can be constructed by selecting component values such that the resonant frequency of the circuit shown in FIG. 2 is 3.760 GHz (which is twice the operating frequency). Continuing with the same example, the fourth harmonic short (130) can be constructed by selecting component values such that the resonant frequency of the circuit shown in FIG. 2 is 7.520 GHz.

A transmission line stub can also be used as a second harmonic short to eliminate the third order intermodulation and to shape the output square wave. A transmission line stub is a shorted quarter wavelength stub that looks like an open at the fundamental frequency (e.g. operating frequency) and all corresponding odd harmonics, and looks like a short at all corresponding even harmonics. The skilled person will know that any transmission line with a length equal to an odd multiple of a quarter wavelength at the fundamental frequency will act similarly to the described shorted quarter wavelength stub.

Figure 3:
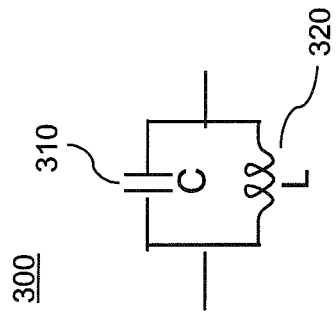
FIG. 3 shows an example implementation of a harmonic open.
Figure 3A:
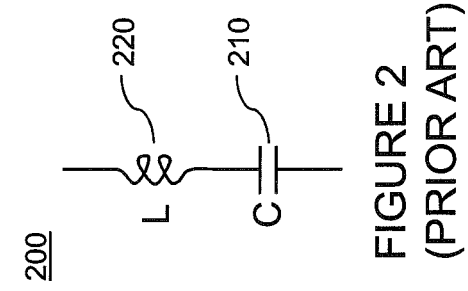
FIG. 3A shows an example implementation of a variable harmonic open.

FIG. 3 shows an example implementation of a harmonic open. Such a circuit can be used to construct both the third harmonic open (145) and the fifth harmonic open (150) shown in FIG. 1A with appropriate modifications in component values. Resonant frequency of the harmonic open shown in FIG. 3 can be determined according to the formula $f_r=1/(2\pi\sqrt{LC})$, where $f_r$ represents the resonant frequency, which is an odd harmonic of the operating frequency, L represents inductance of inductor (320) in henries, and C represents capacitance of capacitor (310) in farads. At the resonant frequency, the circuit shown in FIG. 3 can present an extremely high impedance, equivalent to an open circuit. Generally, this circuit is designed in such a way that at the resonant frequency, the impedance of the circuit is more than ten times larger than the design impedance and thus acting like an open circuit. By making the inductor (320) and/or the capacitor (310) variable, the resonant frequency can be varied. FIG. 3A shows such a configuration, where the capacitor (310a) and the inductor (320a) are variable (e.g. DTC, DTL). By way of example, and not of limitation, if the operating frequency is 1.950 GHz, the third harmonic open (145) can be constructed by selecting component values such that the resonant frequency of the circuit shown in FIG. 3 is 5.580 GHz. Continuing with the same example, the fifth harmonic open (130) can be constructed by selecting component values such that the resonant frequency of the circuit shown in FIG. 3 is 9.750 GHz.

By way of example and not of limitation, capacitor (310a) of FIG. 3A can comprise a digitally tunable capacitor (DTC). Component values can be selected such that the circuit shown in FIG. 3-3A presents an open at a given frequency of interest (e.g. the third harmonic or the fifth harmonic of the fundamental frequency). Since the circuit shown in FIG. 3A is constructed using a DTC and/or a DTL, a change in the operating frequency can be compensated for by a change in capacitance/inductance value of the DTC and/or the DTL such that the circuit continues to present an open at either the third or the fifth harmonic as needed.

Alternative to or in conjunction with a tunable matching network, the variable impedance matching network (165) can comprise a switchable impedance transformer. FIGS. 4A-4D show possible implementations of a switchable impedance transformer. The embodiment shown in FIG. 4A comprises a series-connected tunable reactance (410) and two shunt-connected fixed admittances (420, 430). The two shunt-connected fixed admittances (420, 430) can be alternately connected to or disconnected from ground depending on operation of switch (475). Component value of admittance (420) can be chosen such that when switch (475) connects the $Y_1$ selection terminal (480) to ground and the tunable reactance (410) is tuned appropriately, impedance of the load (170) can be transformed to $Z_1$. A person skilled in the art will recognize the combination of the tunable reactance (410) and the fixed admittance (420) as a standard L-match, which can be designed using standard techniques known in the art of RF circuit design. In a similar manner, component value of admittance (430) can be chosen such that when switch (475) connects the $Y_2$ selection terminal (485) to ground and the tunable reactance (410) is tuned appropriately, the impedance of the load (170) can be transformed to $Z_2$. By way of example and not of limitation, $Z_1$ may be 5Ω (e.g. for an exemplary case of WCDMA at 28 dBm (0.63 W), to be discussed below) and $Z_2$ may be 2Ω (e.g. for an exemplary case of GMSK at 34.5 dBm (2.8 W), to be discussed below). Alternatively, as shown in FIG. 4B, the tunable reactance (410) can be replaced by an arrangement comprising two switches (440B, 450B), which can operate in tandem to select one of two series-connected reactances (460B, 470B). When switch (475) connects the $Y_1$ selection terminal (480) to ground and the corresponding series-connected reactance (460B) is connected in series by appropriate operation of switches (440B, 450B), an L-match comprising series-connected reactance (460B) and shunt-connected admittance (420) can transform impedance of the load (170) to $Z_1$. In a similar manner, when switch (475) connects the $Y_2$ selection terminal (485) to ground and the corresponding series-connected reactance (470B) is connected in series by appropriate operation of switches (440B, 450B), an L-match comprising series-connected reactance (470B) and shunt-connected admittance (430) can transform impedance of the load (170) to $Z_2$.

Figure 4A:
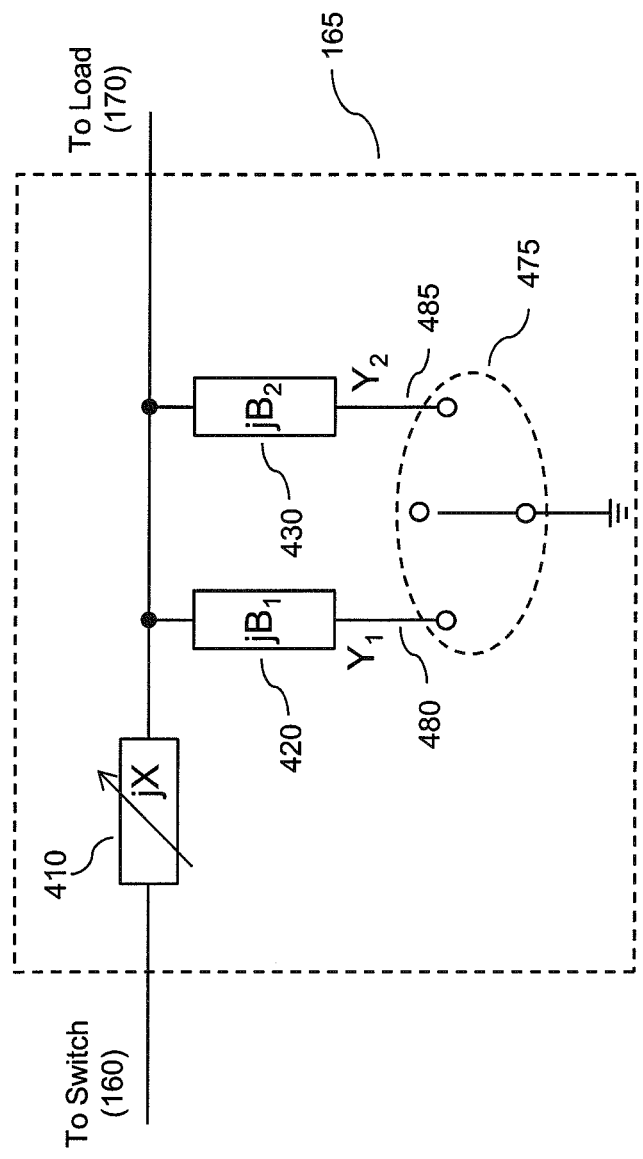
FIGS. 4A-4D show possible implementations of a switchable impedance transformer.
Figure 4B:
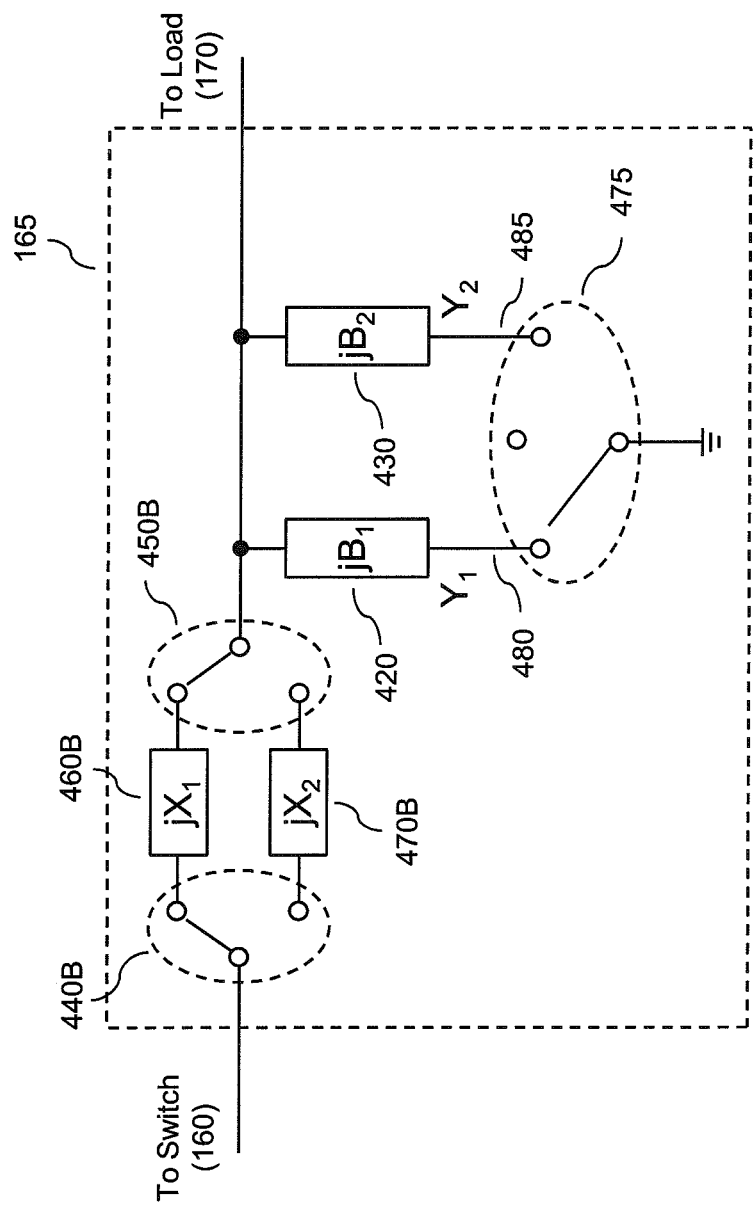
Figure 4C:
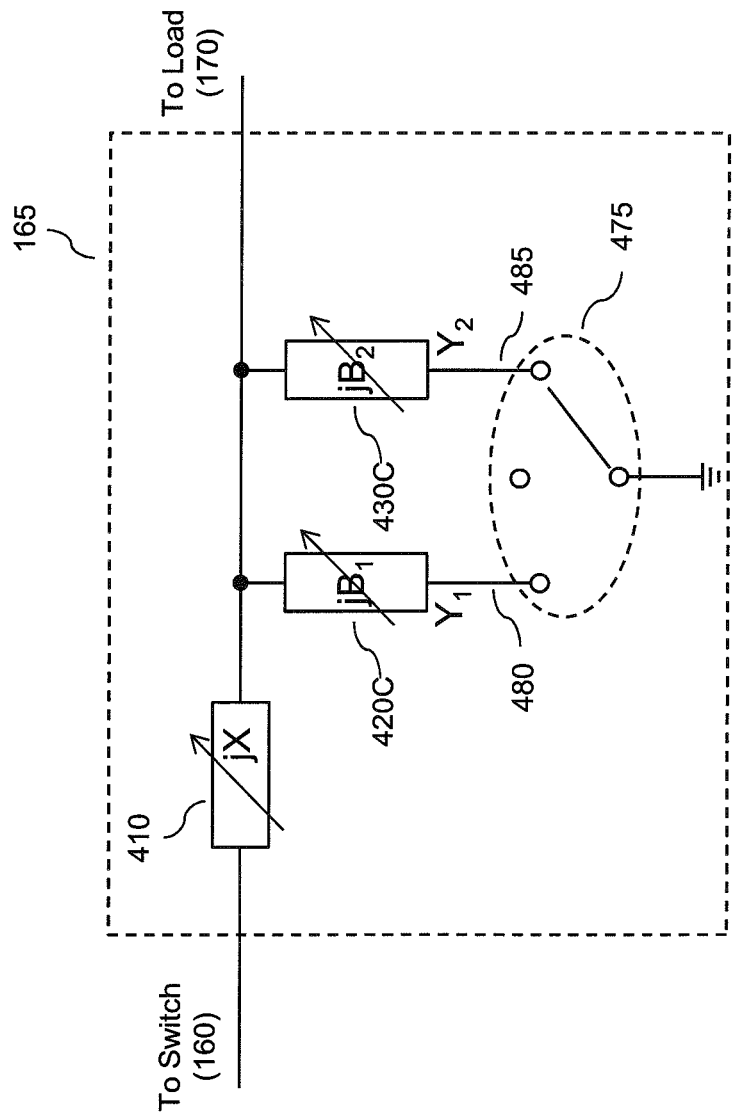
Figure 4D:
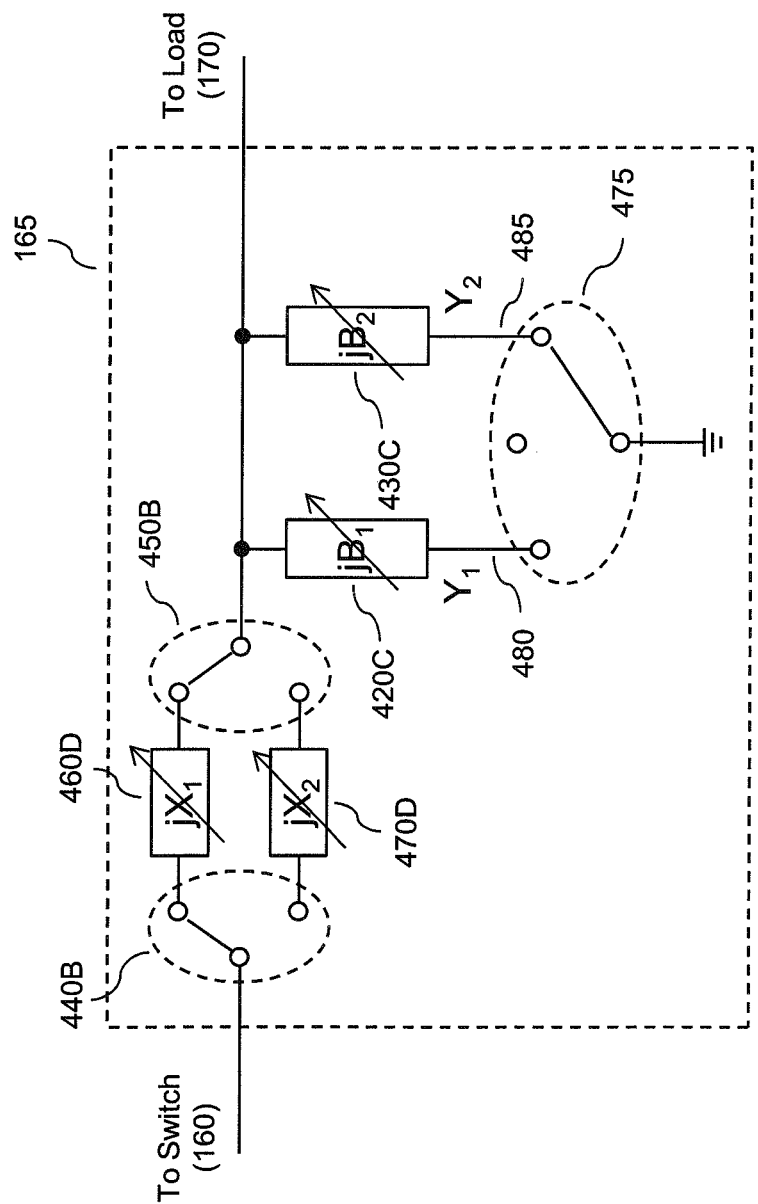

As with the arrangement shown in FIG. 4A, appropriate component values can be calculated using standard techniques for design of an L-match, which would be known to a person skilled in the art. The impedance transformers shown in FIGS. 4A and 4B can be made adaptable to different frequency bands by using tunable admittances/reactances instead of fixed admittances/reactances. Such modifications to the impedance transformers of FIGS. 4A and 4B are shown in FIGS. 4C and 4D, respectively, where one or more of the fixed admittances/reactances are replaced by tunable admittances/reactances.

Other considerations regarding the switchable impedance transformers shown in FIGS. 4A-4D include transformation to more than two different impedance values as well as bandwidth. The arrangements shown in FIGS. 4A-4D can be readily modified by a person skilled in the art to provide three or more different impedance transformations by increasing a number of admittances (or reactances) that can be chosen from by operation of switches (475, 440B, 450B). Regarding bandwidth, in general, operational bandwidth of an impedance matching network is a function of the Q factor (quality factor) of the impedance matching network, with a higher Q factor resulting in narrower bandwidth. Standard design techniques that would be known to a person skilled in the art (e.g. appropriate design and use of T-networks, pi-networks, and/or cascaded L-match networks) can be used to design a matching network to adjust the Q factor and thereby meet a particular bandwidth specification. In general, more tuning elements in the matching network allow for wider bandwidth. The skilled person will know that transmission line segments and stubs are also viable solutions for implementing matching networks and impedance transformers.

FIGS. 5A and 5B show example configurations of transmission line tuning that can be used for implementing matching networks and impedance transformers. In both configurations (500a, 500b) of FIGS. 5A and 5B, a switch (580, 590) is used to select an effective conductance path of different length, the conductance path being a transmission line of a given length. The skilled person will know that given an open or shorted transmission line of characteristic impedance $Z_0$, the effective impedance of the transmission line will be based on its length. In configuration (500a) of FIG. 5A, the length is varied by selecting one of two transmission lines (510, 520) of different lengths via switch (580). In configuration (500b) of FIG. 5B, the length of the path is varied by shorting out (e.g. bypassing) portion of the path defined by transmission line segments (530-570) via a switch (590). As shown in FIG. 5B, upon activation the switch shortens the conduction path by removing transmission line segments (540, 550, 560) from the conduction path. Finally, by selecting the effective conduction path length (through transmission lines and switches) to be multiple of a half wavelength for an open line (as shown in FIG. 5A) or a multiple of a quarter wavelength long of a frequency of interest, tuning to various frequencies (or frequency changes), such as to providing various frequency terminations, is rendered possible by configurations (500a, 500b) depicted in FIGS. 5A and 5B. It should be noted that configurations (500a, 500b) of FIGS. 5A and 5B can be expanded to contain multiple effective conductance paths by increasing the number of switches and/or transmission lines.

By way of example and not of limitation, embodiments of the present disclosure may be used in the construction of a cellular phone. A typical cellular phone may comprise a control unit that coordinates operation of elements of the cellular phone. Such a control unit may provide control signals that control switches and tunable elements that are present in embodiments of the present disclosure. In general, switches and tunable elements that are present in embodiments of the present disclosure may be controlled by control signals that are provided by an outside source (e.g. a microcontroller). Such control signals may be determined by a frequency band and/or modulation and coding scheme of operation. Such control signals may, by way of example, be digital signals. In some embodiments such controls may be provided by a digital signal processor (DSP) in the cellular phone or the transceiver unit which are aware of the modulation scheme and corresponding frequency.

In general, appropriate tuning of some tunable elements (410, 420C, 430C, 460D, 470D) of the switchable impedance transformer presented in FIGS. 4A-4D (an embodiment of the variable impedance matching network (165)) can adapt embodiments of the present disclosure for operation on different frequency bands by virtue of adjusting the switchable impedance transformer for different frequencies as needed. Appropriate tuning of the tunable element (410, 460D, 470D) of the switchable impedance transformer presented in FIGS. 4A-4D in combination with appropriate switching of switches (440B, 450B, 475) constructing the tunable impedance transformer presented in FIGS. 4A-4D can adapt embodiments of the present disclosure for operation with different modulation and coding schemes by virtue of adjusting impedance that is presented to the drain terminal (107) of the amplifier (105).

Although in the various embodiments of the present disclosure the switches (123, 125, 135, 160, 185, 440B, 450B and 475) are depicted as a single switch, a single switch, such as switch (123), can be replaced in some cases with a plurality of serially connected switches as described in the following paragraph.

Utilization of a plurality of serially connected switches may be for reliability considerations. For instance, in the case of transistors (e.g. FETs) being utilized as switches, the transistors have a maximum amount of voltage, also referred to as a breakdown voltage or withstand voltage, that can be placed from drain to source of any particular transistor. Above the withstand voltage, the transistors used in implementing a system can break down, leaving the system unable to accomplish an intended purpose. A transistor stack, where two or more transistors are serially connected, can be utilized to allow the serially connected transistors to share a voltage applied to the transistor stack. For example, if each transistor has a withstand voltage of around 3 V, then a stack of five transistors would ideally be expected to have a withstand voltage of around 15 V. Consequently, a higher number of stacked transistors can be used in systems that involve higher voltages in order to withstand these higher voltages.

By way of example and not of limitation, embodiments of the present disclosure were described using amplifiers in the voltage mode (e.g. shaping an output voltage), and thus circuit topologies for the various impedance terminations were made accordingly. The skilled person will know that all these embodiments can also be described using the inverse classes of amplifiers (e.g. class $D^{-1}$, $F^{-1}$ for operation in the current mode) where output currents are shaped, in which case inverse circuit topologies to one described would apply. This means for example that instead of shorts at even and opens at odd harmonics for the case of the voltage mode, placing the shorts at odd and opens at even harmonics, provide the corresponding inverse circuit topologies for the case of current mode. Considering a power amplifier (PA) arrangement, including the active amplifier and a load network (e.g. shaping elements), by duality, it can be transformed into its dual where the role of current and voltage are switched by imposing the complementary admittance condition upon the load network.

A person skilled in the art will be able to extend the teachings of the present disclosure to other modulation and coding schemes and other frequency bands in a manner similar to what has already been discussed in the present disclosure. Accordingly, what has been shown are devices and methods for variable impedance match and variable harmonic terminations for different modulation and coding schemes. While the devices and methods have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein A number of embodiments of the present inventive concept have been described. Nevertheless, it will be understood that various modifications may be made without departing from the scope of the inventive teachings.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

The invention claimed is:

1. An arrangement configured to receive and amplify a first signal, the arrangement comprising:

an amplifier having an amplifier output terminal, the amplifier configured to generate a second signal by amplifying the first signal;

two or more shunt harmonic terminations, configured to be operatively connected between the amplifier output terminal and a reference voltage, and one or more switches operatively connected to the two or more shunt harmonic terminations, wherein:

the one or more switches are configured to selectively decouple the amplifier output terminal from the two or more shunt harmonic terminations;

a switch of the one or more switches is configured to selectively decouple the amplifier output terminal from either one of at least one of the two or more shunt harmonic terminations, and including a configuration where the amplifier output terminal is decoupled from all of the at least two shunt harmonic terminations;

a shunt harmonic termination of the two or more shunt harmonic terminations comprises variable elements; and each of the two or more shunt harmonic terminations is configured to resonate at a corresponding harmonic resonant frequency.

2. The arrangement according to claim 1, wherein the one or more switches have an ON or OFF state, the ON or OFF state being in correspondence of one of: a) a modulation scheme of the first signal, b) a frequency of operation of the first signal, and c) a desired class of operation of the amplifier.

3. The arrangement according to claim 2, further comprising an impedance matching network coupled to at least one switch of the one or more switches.

4. The arrangement according to claim 3, wherein the amplifier is selected from the group consisting of: a) a stacked arrangement of power amplifiers (PA), and b) a scalable periphery amplifier.

5. The arrangement according to claim 3, wherein one or more switches of the one or more switches are constructed using stacked FETs.

6. The arrangement according to claim 2, wherein the amplifier is selected from the group consisting of: a) a stacked arrangement of power amplifiers (PA), and b) a scalable periphery amplifier.

7. The arrangement according to claim 2, wherein one or more switches of the one or more switches are constructed using stacked FETs.

8. The arrangement according to claim 1, further comprising a variable impedance matching network operatively coupled to the amplifier output terminal and configured to match an impedance at the output terminal of the amplifier to a load impedance coupled to the output of the variable impedance matching network.

9. The arrangement according to claim 8, wherein the one or more switches have an ON or OFF state, the ON or OFF state being in correspondence of one of: a) a modulation scheme of the first signal, b) a frequency of operation of the first signal, and c) a desired class of operation of the amplifier.

10. The arrangement according to claim 9, wherein the amplifier is selected from the group consisting of: a) a stacked arrangement of power amplifiers (PA), and b) a scalable periphery amplifier.

11. The arrangement according to claim 9, wherein one or more switches of the one or more switches are constructed using stacked FETs.

12. The arrangement according to claim 1, wherein at least one shunt harmonic termination of the one or more shunt harmonic terminations is tunable.

13. The arrangement of claim 1, wherein the operatively connected between the amplifier output terminal consists of being directly connected to the amplifier output terminal at one end and directly connected to the reference voltage at the other end.

14. An arrangement configured to receive and amplify a first signal, the arrangement comprising:
- an amplifier having an amplifier output terminal, the amplifier configured to generate a second signal by amplifying the first signal;
- two or more shunt second harmonic terminations, configured to be operatively connected between the amplifier output terminal and a reference voltage, and
- one or more switches operatively connected to the two or more shunt second harmonic terminations, wherein:
- the one or more switches are configured to selectively decouple the amplifier output terminal from the two or more second shunt harmonic terminations;
- a switch of the one or more switches is configured to selectively decouple the amplifier output terminal from either one of the two or more shunt second harmonic terminations;
- a shunt second harmonic termination of the two or more shunt second harmonic terminations comprises variable elements; and
- each of the two or more shunt second harmonic terminations is configured to resonate at a corresponding second harmonic resonant frequency.

* * * * *